US012463013B2

(12) United States Patent
Ikeda et al.

(10) Patent No.: US 12,463,013 B2
(45) Date of Patent: Nov. 4, 2025

(54) PLASMA PROCESSING APPARATUS

(71) Applicant: Tokyo Electron Limited, Tokyo (JP)

(72) Inventors: Taro Ikeda, Nirasaki (JP); Yuki Osada, Nirasaki (JP); Hiroyuki Miyashita, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 90 days.

(21) Appl. No.: 18/583,943

(22) Filed: Feb. 22, 2024

(65) Prior Publication Data

US 2024/0297020 A1 Sep. 5, 2024

(30) Foreign Application Priority Data

Mar. 1, 2023 (JP) ................................ 2023-031114

(51) Int. Cl.
*H01J 37/32* (2006.01)

(52) U.S. Cl.
CPC .... *H01J 37/32256* (2013.01); *H01J 37/3222* (2013.01); *H01J 37/32238* (2013.01); *H01J 37/32293* (2013.01)

(58) Field of Classification Search
None
See application file for complete search history.

(56) References Cited

U.S. PATENT DOCUMENTS

2025/0104977 A1* 3/2025 Ikeda .................. H01J 37/3244

FOREIGN PATENT DOCUMENTS

JP 2011-014542 A 1/2011

* cited by examiner

*Primary Examiner* — Kenneth B Wells
(74) *Attorney, Agent, or Firm* — Armstrong Teasdale LLP

(57) ABSTRACT

A plasma processing apparatus includes: a processing container; a resonator configured to resonate electromagnetic waves to be supplied; a slot antenna connected to the resonator; and a transmission window configured to transmit the electromagnetic waves radiated from the slot antenna and supply the electromagnetic waves into the processing container, wherein the resonator includes: an input port including an inner shaft and an outer cylinder; an output port including an inner shaft and an outer cylinder; a power supply fin connecting the inner shaft of the input port and the inner shaft of the output port and provided in the resonator; and a ground fin connected to the outer cylinder of the input port and the outer cylinder of the output port at a same potential and provided to protrude within the resonator so as to be inserted between fins of the power supply fin.

10 Claims, 7 Drawing Sheets

PLASMA PROCESSING APPARATUS

CROSS-REFERENCE TO RELATED APPLICATION

This application is based upon and claims the benefit of priority from Japanese Patent Application No. 2023-031114, filed on Mar. 1, 2023, the entire contents of which are incorporated herein by reference.

TECHNICAL FIELD

The present disclosure relates to a plasma processing apparatus.

BACKGROUND

A plasma processing apparatus is disclosed that includes a microwave generator for generating microwaves of a predetermined wavelength, an antenna for radiating the microwaves generated by the microwave generator, a coaxial waveguide guiding the microwaves generated by the microwave generator to the antenna and having a coaxial structure composed of an outer tube and an inner tube having an end to which the antenna is installed, a resonator made of a dielectric material, holding the antenna, and in which standing waves by the microwaves radiated from the antenna are formed, and a plasma excitation chamber having an open surface on which the resonator is disposed and configured to guide the microwaves radiated from the antenna through the resonator and to be supplied with a processing gas that is excited by the microwaves (Patent Document 1).

PRIOR ART DOCUMENTS

Patent Document

Patent Document 1: Japanese Patent Laid-Open Publication No. 2011-014542

SUMMARY

According to one embodiment of the present disclosure, there is provided a plasma processing apparatus, including: a processing container; a resonator configured to resonate electromagnetic waves to be supplied; a slot antenna connected to the resonator; and a transmission window configured to transmit the electromagnetic waves radiated from the slot antenna and supply the electromagnetic waves into the processing container, wherein the resonator includes: an input port including an inner shaft and an outer cylinder; an output port including an inner shaft and an outer cylinder; a power supply fin connecting the inner shaft of the input port and the inner shaft of the output port and provided in the resonator; and a ground fin connected to the outer cylinder of the input port and the outer cylinder of the output port at a same potential and provided to protrude within the resonator so as to be inserted between fins of the power supply fin.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of a plasma processing apparatus will be described in detail with reference to the drawings. Additionally, the technology disclosed herein is not limited to the following embodiments.

When microwave plasma is used as a plasma source in a plasma processing apparatus, radio-frequency components such as a mode converter and a matcher are used. These radio-frequency components use coils or capacitors and since their dimensions increase as a structure becomes complex, constraints are imposed upon embedding the radio-frequency components in the plasma processing apparatus of the plasma source. Therefore, it is expected to miniaturize the plasma source while achieving high efficiency.

[Configuration of Plasma Processing Apparatus 1]

Figure 1:
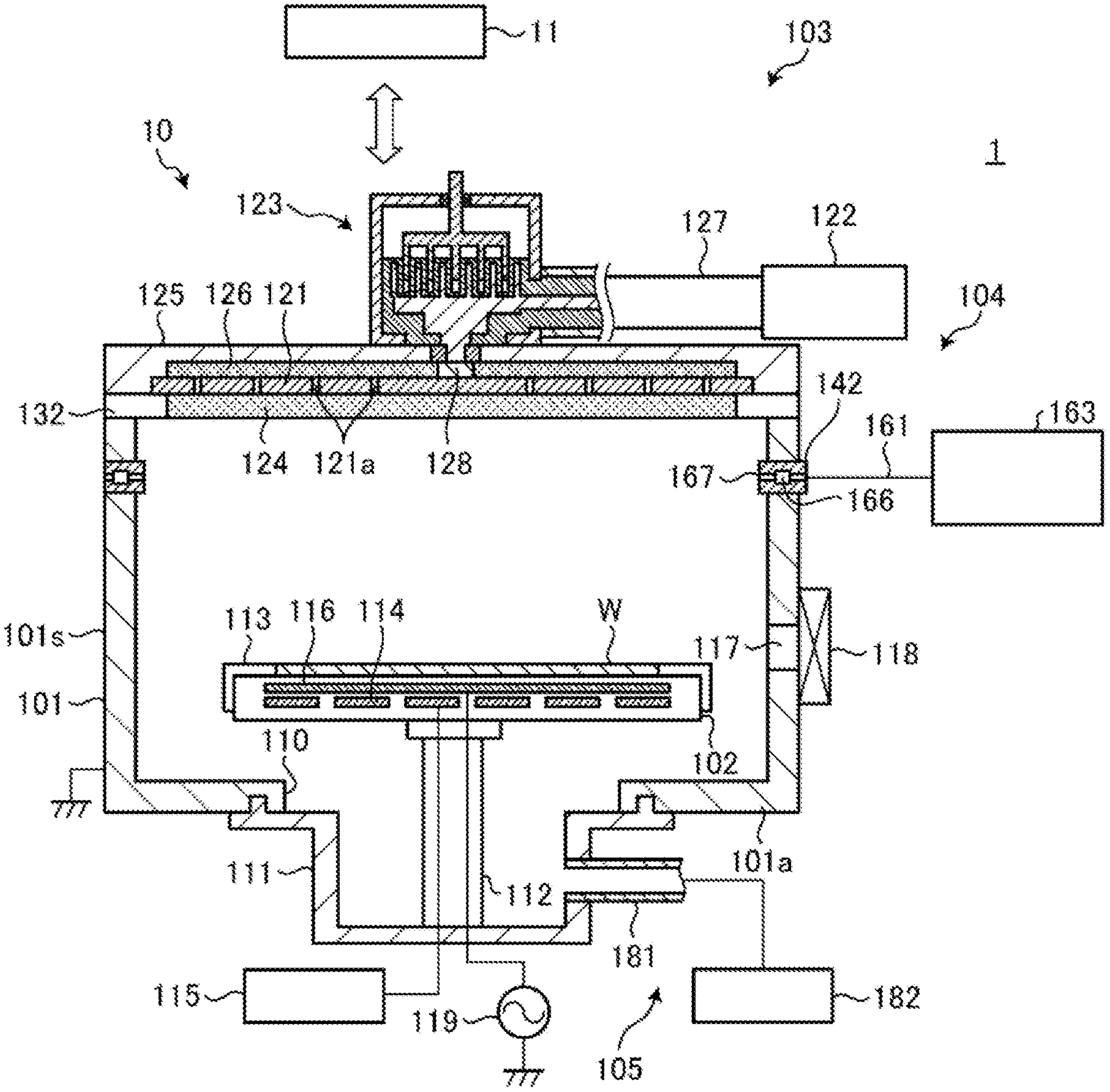
FIG. 1 is a schematic cross-sectional diagram showing an example of a plasma processing apparatus according to an embodiment of the present disclosure.

FIG. 1 is a schematic cross-sectional diagram showing an example of a plasma processing apparatus according to an embodiment of the present disclosure. The plasma processing apparatus 1 shown in FIG. 1 is configured, for example, as a plasma processing apparatus of an RLSA™ microwave plasma type.

The plasma processing apparatus 1 includes an apparatus main body 10, and a controller 11 that controls the apparatus main body 10. The apparatus main body 10 includes a chamber 101, a stage 102, a microwave introducer 103, a gas supply mechanism 104, and an exhaust mechanism 105.

The chamber 101 is formed in a substantially cylindrical shape, and an opening 110 is formed at a substantially central portion of a bottom wall 101*a* of the chamber 101. The bottom wall 101*a* is provided with an exhaust chamber 111 that is connected with the opening 110 and protrudes downward. An opening 117 through which a substrate (hereinafter also referred to as a wafer) W passes is formed at a side wall 101*s* of the chamber 101, and the opening 117 is opened and closed by a gate valve 118. The chamber 101 is an example of a processing container.

The substrate W to be processed is placed on the stage 102. The stage 102 has a substantially disc-shape and is made of a ceramic such as AlN. The stage 102 is supported by a support member 112 of a cylindrical shape, which extends upward from a substantially center of a bottom of the exhaust chamber 111 and is made of a ceramic such as AlN. An edge ring 113 provided at an outer edge of the stage 102 surrounds the substrate W placed on the stage 102. Further, a lifting pin (not shown) for raising and lowering the substrate W is provided inside the stage 102, allowing the lifting pin to protrude and retract with respect to an upper surface of the stage 102.

Furthermore, a resistance heating type heater 114 is embedded inside the stage 102, and the heater 114 heats the substrate W placed on the stage 102 according to power supplied from a heater power source 115. Further, a thermocouple (not shown) is inserted into the stage 102, allowing a temperature of the substrate W to be controlled, for example, in a range of 350 to 850 degrees C., based on a signal from the thermocouple. In addition, an electrode 116 having approximately a size same as a size of the substrate W is buried above the heater 114 in the stage 102, and a bias power source 119 is electrically connected to the electrode 116. The bias power source 119 supplies bias power of a predetermined frequency and magnitude to the electrode 116. Ions are drawn into the substrate W placed on the stage 102 by the bias power supplied to the electrode 116. The bias power source 119 may not be provided depending on characteristics of plasma processing.

The microwave introducer 103 is provided above the chamber 101 and includes an antenna 121, a microwave output 122, and a resonator 123. The antenna 121 is formed with slots 121*a*, which are through-holes. The microwave output 122 outputs microwaves. The resonator 123 guides the microwaves outputted from the microwave output 122 to the antenna 121.

A dielectric window 124 made of a dielectric is provided below the antenna 121. The dielectric window 124 is supported by a support member 132 provided in a ring-shape at an upper portion of the chamber 101. A slow wave plate 126 is provided on the antenna 121. A shield member 125 is provided on the antenna 121. A flow path (not shown) is provided inside the shield member 125, and the shield member 125 cools the antenna 121, the dielectric window 124, and the slow wave plate 126 by a fluid, such as water, flowing inside the flow path.

The antenna 121 is formed of, for example, a copper plate or an aluminum plate, a surface of which is plated with silver or gold, and has the slots 121*a* arranged in a predetermined pattern for radiating the microwaves. The arrangement pattern of the slots 121*a* is appropriately configured so that the microwaves are evenly radiated. An example of a suitable pattern is radial line slots in which multiple pairs of slots 121*a* are arranged concentrically, with two slots 121*a* arranged in a T-shape as each pair. A length and an arrangement interval of the slots 121*a* are appropriately determined according to an effective wavelength ag of the microwaves. Further, the slots 121*a* may have other shapes such as a circular shape or an arc-shape. Furthermore, an arrangement shape of the slots 121*a* is not particularly limited and may be arranged, for example, spirally or radially, in addition to being arranged concentrically. The arrangement pattern of the slots 121*a* is appropriately configured so that microwave radiation characteristics through which a desired plasma density distribution is obtainable are achieved.

The slow wave plate 126 is made of a dielectric, such as quartz, ceramic ($Al_2O_3$), polytetrafluoroethylene, or polyimide, having a dielectric constant greater than that of a vacuum. The slow wave plate 126 functions to make the antenna 121 smaller by shortening the wavelength of the microwaves than that in a vacuum. The dielectric window 124 is also made of the dielectric.

Thicknesses of the dielectric window 124 and the slow wave plate 126 are adjusted so that an equivalent circuit, formed by the slow wave plate 126, the antenna 121, the dielectric window 124, and plasma, satisfies a resonance condition. By adjusting the thickness of the slow wave plate 126, a phase of the microwaves is adjustable. By adjusting the thickness of the slow wave plate 126 so that a joint portion of the antenna 121 becomes an "antinode" of a standing wave, reflection of the microwaves is minimized and radiant energy of the microwaves is maximized. Furthermore, by making the slow wave plate 126 and the dielectric window 124 of the same material, interface reflection of the microwaves is prevented.

The microwave output 122 includes a microwave oscillator. The microwave oscillator may be of a magnetron type or a solid-state type. A frequency of microwaves generated by the microwave oscillator is, for example, between 300 MHz and 10 GHz. As an example, the microwave output 122 outputs a microwave of 2.45 GHz by the microwave oscillator of the magnetron type. The microwaves are an example of electromagnetic waves. The microwave output 122 may be an oscillator that oscillates electromagnetic waves in a band of very high frequency (VHF) to ultra high frequency (UHF). As another example, the microwave output 122 outputs an electromagnetic wave of 860 MHz by the microwave oscillator of the solid-state type.

An input port of the resonator 123 is connected to the microwave output 122 via a waveguide 127. Further, an output port of the resonator 123 is connected to the antenna 121 via a power supply portion 128. The resonator 123 matches impedance of load (plasma) in the chamber 101 to output impedance of the microwave output 122. A mode conversion mechanism between the microwave output 122 and the power supply portion 128 is omitted since the resonator 123 has such a function. The waveguide 127 guides the microwaves outputted from the microwave output 122 to the resonator 123. The power supply portion 128 is connected to a center of the antenna 121. The microwaves outputted from the microwave output 122 propagate to the slow wave plate 126 via the resonator 123 and the power supply portion 128, and are radiated into the chamber 101 from the slow wave plate 126 via the slots 121*a* of the antenna 121 and the dielectric window 124.

The gas supply mechanism 104 includes a shower ring 142 provided in a ring-shape along an inner wall of the chamber 101. The shower ring 142 has a ring-shaped flow path 166 provided therein and discharge ports 167 connected to the flow path 166 and opened inside the flow path 166. A gas supplier 163 is connected to the flow path 166 via a pipe 161. The gas supplier 163 is provided with gas sources and flow rate controllers. In an embodiment, the gas supplier 163 is configured to supply at least one processing gas from a corresponding gas source to the shower ring 142 via a corresponding flow rate controller. A gas supplied to the shower ring 142 is supplied into the chamber 101 from the discharge ports 167.

The exhaust mechanism 105 includes the exhaust chamber 111, an exhaust pipe 181 provided on a side wall of the exhaust chamber 111, and an exhauster 182 connected to the exhaust pipe 181. The exhauster 182 includes a vacuum pump, a pressure control valve, and the like.

The controller 11 includes a memory, a processor, and an input/output interface. The memory stores a program executed by the processor and a recipe including each processing condition and the like. The processor executes the program read from the memory and controls each part of the apparatus main body 10 via the input/output interface based on the recipe stored in the memory. For example, the controller 11 controls each part of the plasma processing apparatus 1 to perform film formation processing.

[Structure of Resonator 123]

Figure 2:
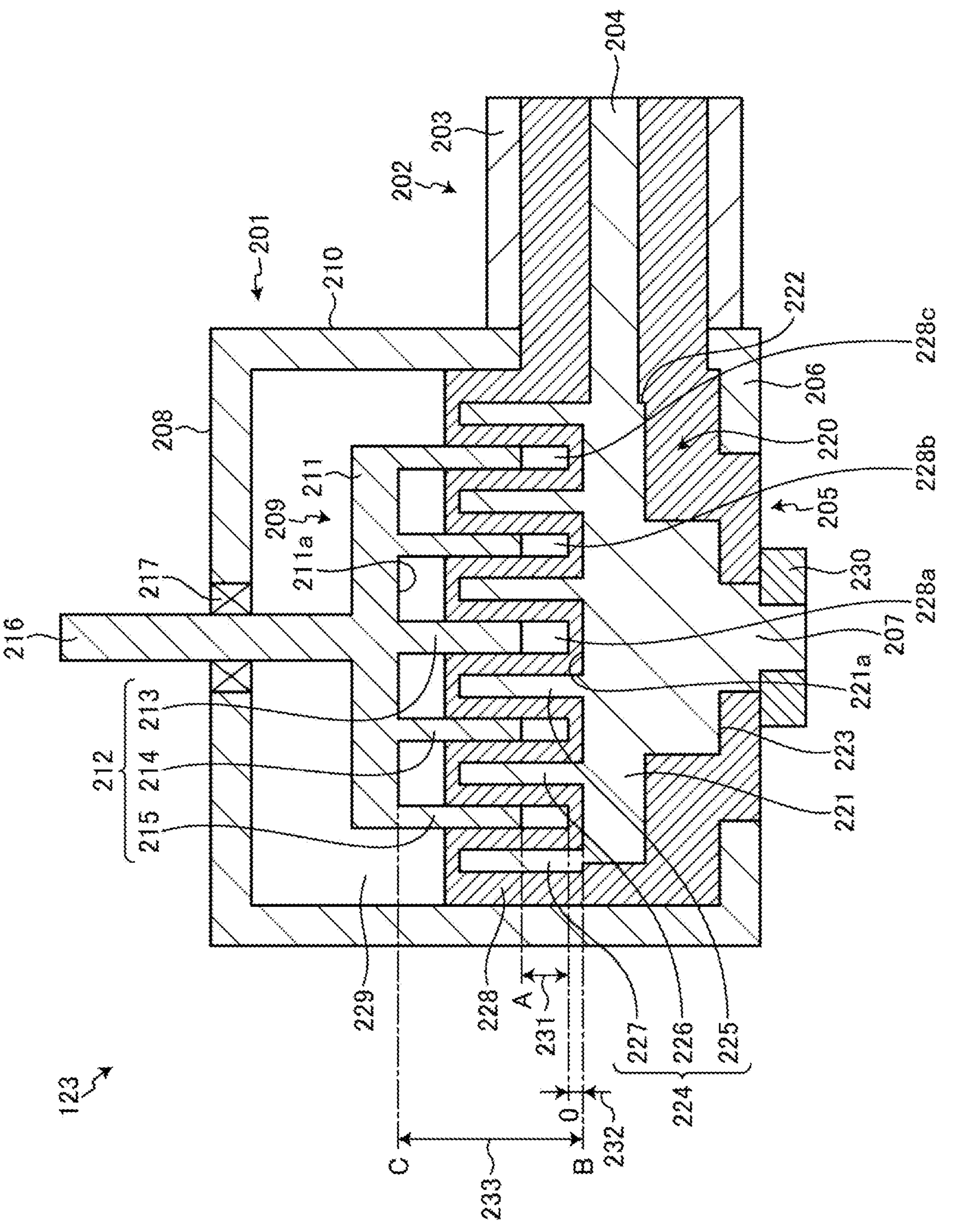
FIG. 2 is a cross-sectional diagram showing an example of a configuration of a resonator according to the embodiment of the present disclosure.
Figure 3:
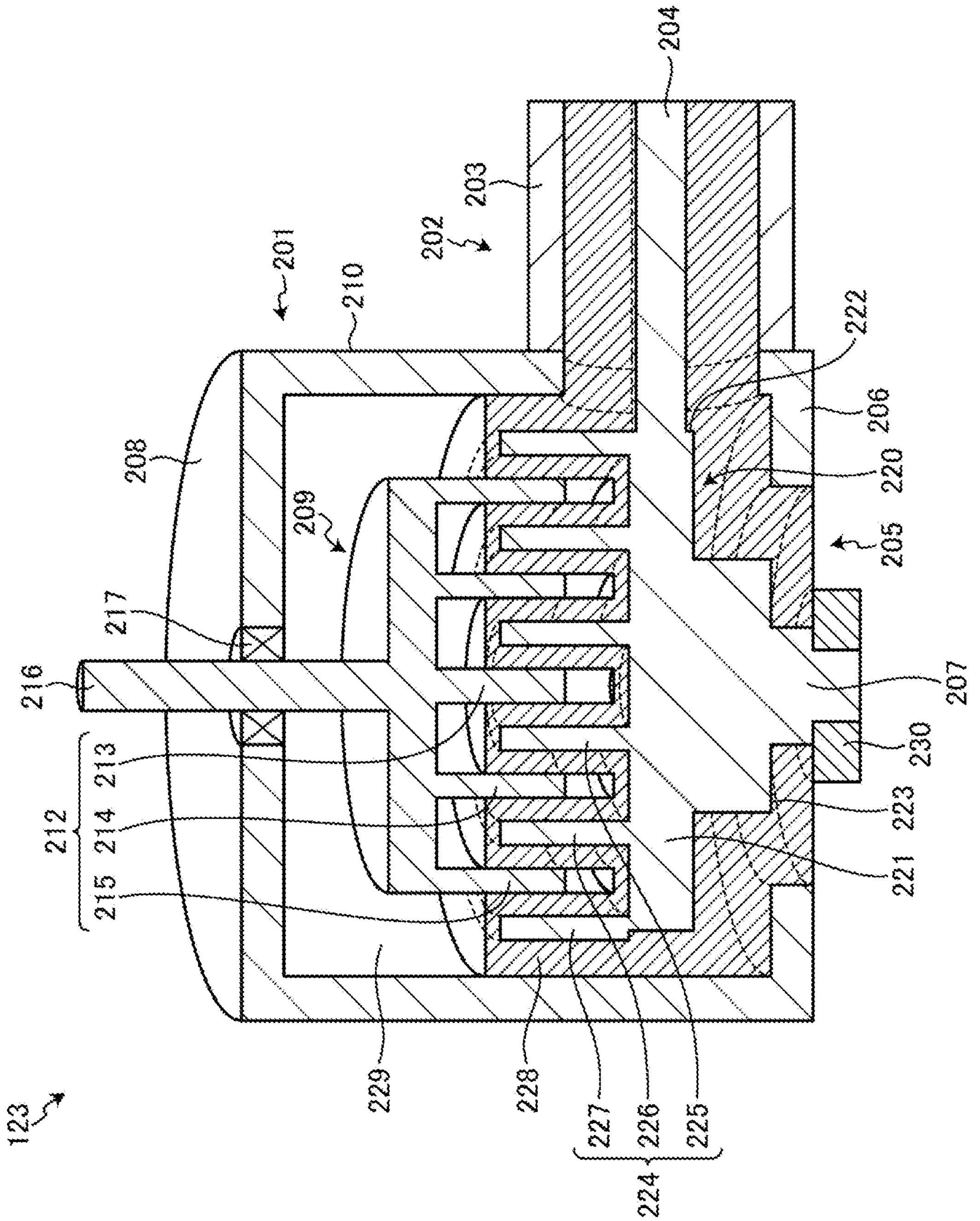
FIG. 3 is a perspective view showing an example of a state in which the cross-sectional diagram of FIG. 2 is rotated.

Next, details of the resonator 123 will be described with reference to FIGS. 2 and 3. FIG. 2 is a cross-sectional diagram showing an example of a configuration of the resonator according to the embodiment of the present disclosure. FIG. 3 is a perspective view showing an example of a state in which the cross-sectional diagram of FIG. 2 is rotated. As shown in FIGS. 2 and 3, the resonator 123 has a housing 201. The housing 201 is made of a conductor such as aluminum or copper. Furthermore, the housing 201 includes an input port 202 and an output port 205. In the embodiment of the present disclosure, based on a flow direction of electromagnetic waves supplied from the microwave output 122, a description will be given by defining a side connected to the waveguide 127 adjoining the microwave output 122 as the input port 202, and a side connected to the power supply portion 128 adjoining the antenna 121 as the output port 205. Connection destinations of the input port 202 and the output port 205 may be switched.

The input port 202 and the output port 205 are formed as outer cylinders (outer conductors) 203 and 206 and inner shafts (inner conductors) 204 and 207, respectively. That is, each of the input port 202 and the output port 205 has a coaxial structure. The outer cylinder 206 is integrated with a lower portion of the housing 201. The housing 201 is electrically connected to the outer cylinders 203 and 206 and becomes a ground potential together with the grounded chamber 101 via a coaxial cable connected to the input port 202 or via a frame on which the resonator 123 is installed. The housing 201 is in the shape of a cylinder, and the input port 202 is formed on a side surface 210 of the cylinder. Also, the housing 201 may have a cylindrical shape with a square cross-section. Further, in the housing 201, the output port 205 is formed at one end of the cylinder near where the input port 202 is formed, and the other end 208 is formed in a disc-shape to close the cylinder. A bearing 217 is provided at a center of the end 208 and holds a rod-shaped portion 216 for moving a ground fin 209 up and down.

The ground fin 209 is made of a conductor such as aluminum or copper. The ground fin 209 includes a base 211, a fin portion 212 consisting of fins 213 to 215, and the rod-shaped portion 216. The fins 213 to 215 of the fin portion 212 provided inside the housing 201 so as to protrude toward the output port 205 are connected to the base 211. Further, the rod-shaped portion 216 provided to protrude toward the end 208 is connected to the base 211. The fin 214 is provided to protrude into the housing 201 around the fin 213 in a cylindrical shape. The fin 215 is provided to protrude into the housing 201 around the fin 214 in a cylindrical shape. That is, the fins 213 to 215 of the fin portion 212 have, for example, a concentric columnar shape and a cylindrical shape. The fin portion 212 as appears a comb-like shape in the cross-sectional diagram of FIG. 2.

A power supply fin 224 is provided inside the housing 201. The power supply fin 224 includes a fin 225 formed to surround the fin 213, a fin 226 formed to surround the fin 214, and a fin 227 formed to surround the fin 215. The fins 213 to 215 and the fins 225 to 227 are arranged coaxially. The power supply fin 224 is made of a conductor such as aluminum or copper and has a cylindrical shape with one side closed by a base 221. That is, the power supply fin 224 is a triple cylindrical multipole antenna in which the fins 225 to 227 are connected at the base 221. The power supply fin 224 has a comb-like shape in the cross-sectional diagram of FIG. 2. The base 221 is disc-shaped and a center portion thereof facing the output port 205 is convex. The inner shaft 204 is connected to a side surface 222 of the base 221. The inner shaft 207 is connected to a bottom surface 223 of the convex portion of the base 221. That is, a power supply line 220 insulated from the housing 201 is formed by the inner shaft (input conductor) 204 of the input port 202, the inner shaft (output conductor) 207 of the output port 205, and the power supply fin 224.

A dielectric 228 is provided between the housing 201 and the power supply line 220. That is, the dielectric 228 is arranged between the fin 213 and the fin 225, between the fin 225 and the fin 214, between the fin 214 and the fin 226, between the fin 226 and the fin 215, and between the fin 215 and the fin 227. Likewise, the dielectric 228 is arranged between the fin 227 and the side surface 210 of the cylinder, between the outer cylinder 203 and the inner shaft 204 of the input port 202, and between the outer cylinder 206 and the inner shaft 207 of the output port 205. Tips of the fins 225 to 227 are covered with the dielectric 228 to prevent the ground fin 209 from contacting the fins 225 to 227 even when the ground fin 209 is inserted up to a lowest position. As the dielectric 228, for example, polytetrafluoroethylene (PTFE) or the like may be used. Within the housing 201, the dielectric 228 is not arranged in a space 229 from a position of a surface 211*a* of the base 211 facing the power supply fin 224 up to an inner surface of the end 208, in a state in which the ground fin 209 is fully inserted. In other words, the space 229 becomes a movement space when changing a depth of insertion of the ground fin 209. The dielectric 228 may be omitted.

The ground fin 209 is formed to be, for example, movable manually in the space 229 in the housing 201. The ground fin 209 may also be movable by providing a lead screw at the rod-shaped portion 216 of the ground fin 209 and rotating the lead screw using a stepping motor. In other words, the ground fin 209 is formed so that the depth of insertion into the power supply fin 224 may be changed. Assuming that the tips of the fins 213 to 215 in a state in which the ground fin 209 is fully inserted are at a reference position (position of "0" in FIG. 2) and the side toward the end 208 is a positive position, the ground fin 209 may be movable, for example, in a range 231 (from 0 mm to +6 mm) up to a point A. For example, FIG. 2 shows that the ground fin 209 is at a position of +6 mm, which is a most extracted position. After the ground fin 209 is extracted, grooves 228*a* to 228*c* corresponding to the fins 213 to 215, respectively, are formed. That is, there is no dielectric 228 in the grooves 228*a* to 228*c*. In other words, the fins 213 to 215 of the ground fin 209 are moved along the dielectric 228 when the depth of insertion into the power supply fin 224 is changed. In this way, a frequency (resonance frequency) passing through the resonator 123 may be changed by changing the depth of insertion of the ground fin 209 and thus changing dimensions of a resonant space.

Furthermore, a space corresponding to a section 233 from a point B to a point C in FIG. 2, i.e., an intricate space formed by the fins 225 to 227 of the power supply fin 224 and the fins 213 to 215 of the ground fin 209, forms a standing wave region. In the embodiment of the present disclosure, the section 233, which is the standing wave region, has a length approximating λg/4, which is significantly shorter than λg/2, thereby allowing dimensions of the resonator 123 to be reduced. In a section 232 from a position of "0" to a point B in FIG. 2, which is an interval between the tips of the fins 213 to 215 and an upper surface 221*a* of the base 221, is determined in consideration of a dielectric breakdown voltage of the dielectric 228. For example, when the dielectric 228 is PTFE, the section 232 is determined using a value of 1 kV/mm obtained by considering a safety factor of about 20 times from 19 kV/mm, which is a dielectric breakdown voltage of PTFE.

A phase adjustor 230 is provided to surround the inner shaft 207 near the power supply portion 128 of the output port 205. The phase adjustor 230 strengthens resonance characteristics of the standing wave region of the resonator 123, i.e., increases a Q value. In other words, the phase adjustor 230 adjusts the phase of electromagnetic waves. It is desirable that the phase adjustor 230 be made of a material having a high relative permittivity εr (εr≥4), such as a ceramic. As the ceramic, for example, alumina (εr=10) or the like may be used.

[Simulation Results]

Figure 4:
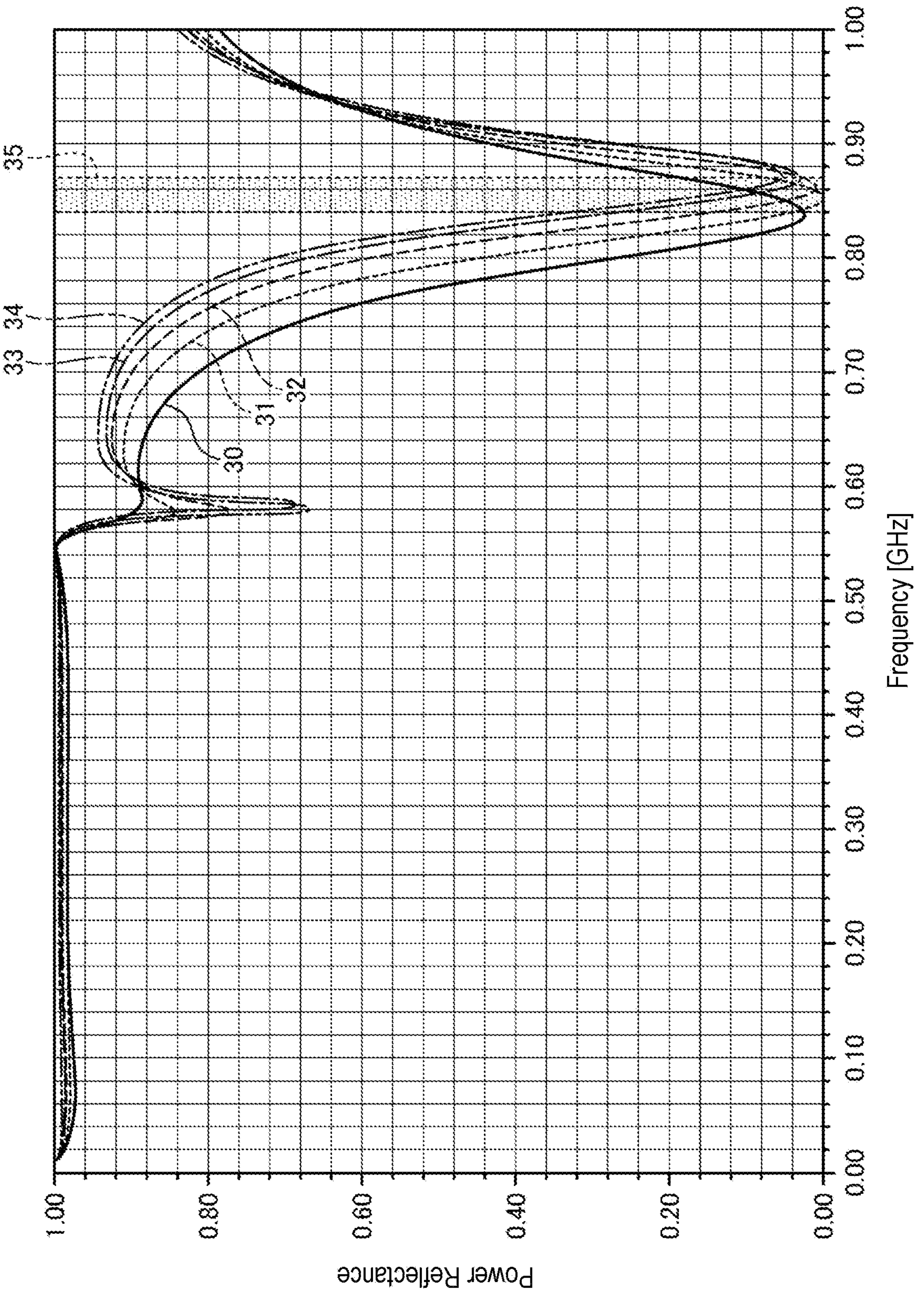
FIG. 4 is a graph showing an example of frequency characteristics of the resonator according to the embodiment of the present disclosure.
Figure 5:
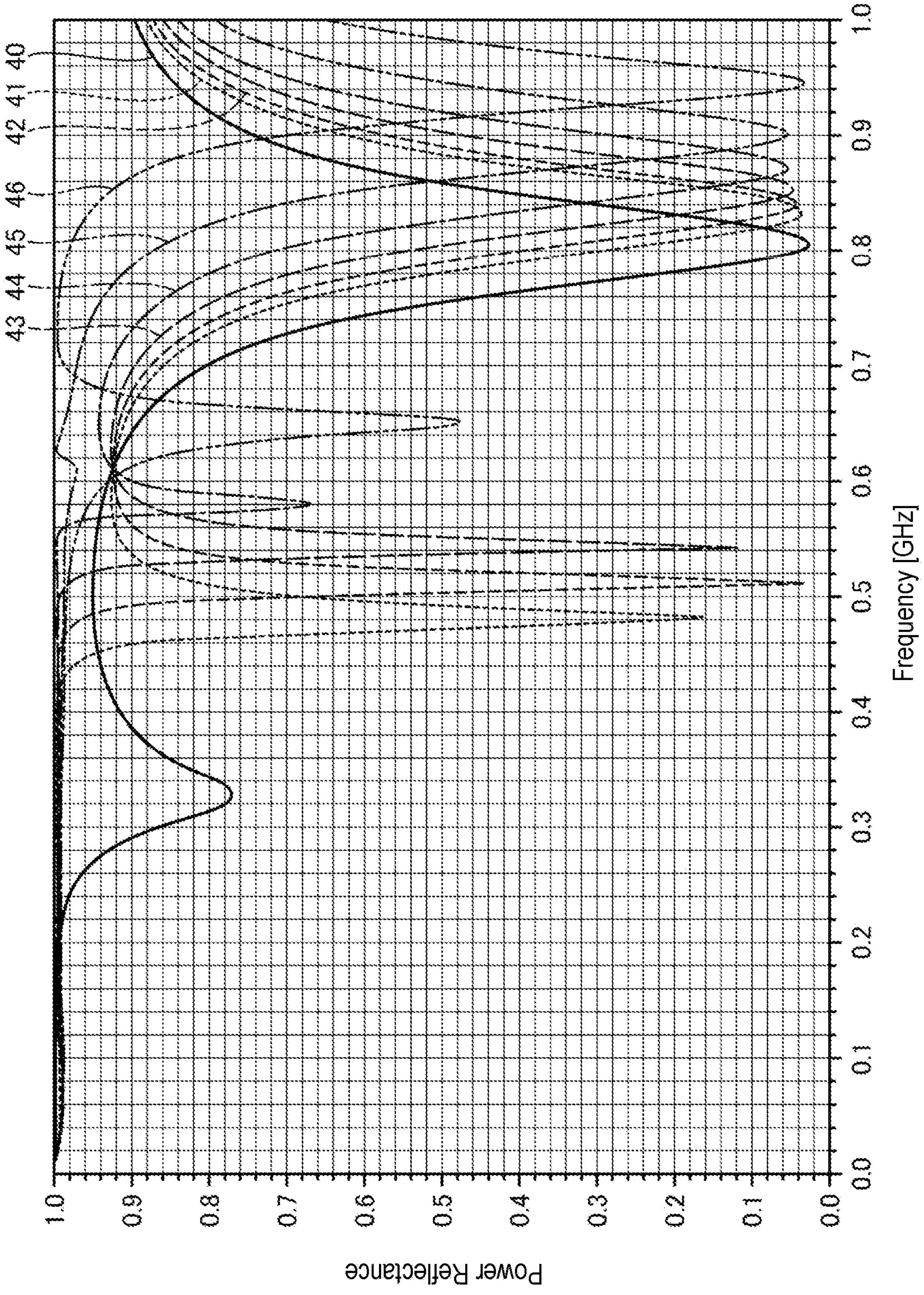
FIG. 5 is a graph showing an example of frequency characteristics of the resonator according to the embodiment of the present disclosure.

Next, simulation results of frequency characteristics of the resonator 123 will be described with reference to FIGS. 4 and 5. FIGS. 4 and 5 are graphs showing an example of the frequency characteristics of the resonator in the embodiment of the present disclosure. Graphs 30 to 34 shown in FIG. 4 represent the frequency characteristics of the resonator 123 in terms of power reflectance when impedance of a load (plasma) changes as a result of a change in plasma density in the chamber 101. The graphs 30 to 34 show the frequency characteristics of the power reflectance when a relative permittivity κp of the plasma is 30, 40, 50, 60, and 70, respectively. As shown in the graphs 30 to 34, a frequency (resonance frequency) at which the power reflectance becomes the smallest generally falls within a range 35 of a width of 30 MHz approximately from 840 MHz to 870 MHz, even if the plasma density changes. Furthermore, when a reference frequency is 860 MHz, a variation in the power reflectance at 860 MHz is within 5% even if the plasma density changes. This is because a resonance in the resonator 123 causes the impedance in the resonator 123 to be very high, and even if the impedance of the plasma, which is the load, changes slightly, the change has little effect on an overall impedance. Further, if a variation in the power reflectance is 5% or less, an output of the electromagnetic waves is controlled by load control (control for constantly maintaining power obtained by subtracting reflected power from input power), so that a specified power is supplied into the chamber 101.

Graphs 40 to 46 shown in FIG. 5 show frequency characteristics in terms of power reflectance when the depth of insertion of the ground fin 209 of the resonator 123 is changed. The graphs 40 to 46 show frequency characteristics when the ground fin 209 is moved in units of 1 mm from a position of 0 mm at which the ground fin 209 is fully inserted to a position of +6 mm at which the ground fin 209 is most extracted. The graph 40 shows a position of 0 mm, and the graph 46 shows a position of +6 mm. As shown in the graphs 40 to 46, a resonance frequency varies from 800 MHz at a position of 0 mm to 950 MHz at a position of +6 mm. In FIG. 5, a vertical axis represents power reflectance, so a frequency at which the power reflectance is the smallest in a desired frequency range (700 MHz to 1 GHz) represents the resonance frequency. That is, the resonator 123 may adjust the resonance frequency by changing the dimensions of the resonant space (standing wave region). In other words, the resonator 123 may be considered to be a bandpass filter, a center frequency (resonance frequency) of which varies in a range of 800 MHz to 950 MHz. The resonator 123 may accommodate multiple frequencies with respect to the resonance frequency by changing the depth of insertion of the ground fin 209 having the fins 213 to 215 into a multipole antenna such as the power supply fin 224. After adjusting the resonance frequency of the resonator 123, the resonance frequency may also be fixed by fixing the rod-shaped portion 216 of the ground fin 209 to the housing 201. In addition, if the power reflectance is 5% or less, the output of electromagnetic waves may be minutely adjusted by load control.

In this way, by providing the resonator 123 directly above the antenna 121, a plasma source may be miniaturized while being highly efficient. Further, since the resonator 123 may be made smaller, the degree of freedom of layout may be improved when one or more resonators 123 and antennas 121 are provided on an upper surface of the chamber 101. Furthermore, since the impedance of the load may be matched by the resonator 123, a separate matcher using a coil or a capacitor is not required.

Comparison with Reference Example

Figure 6:
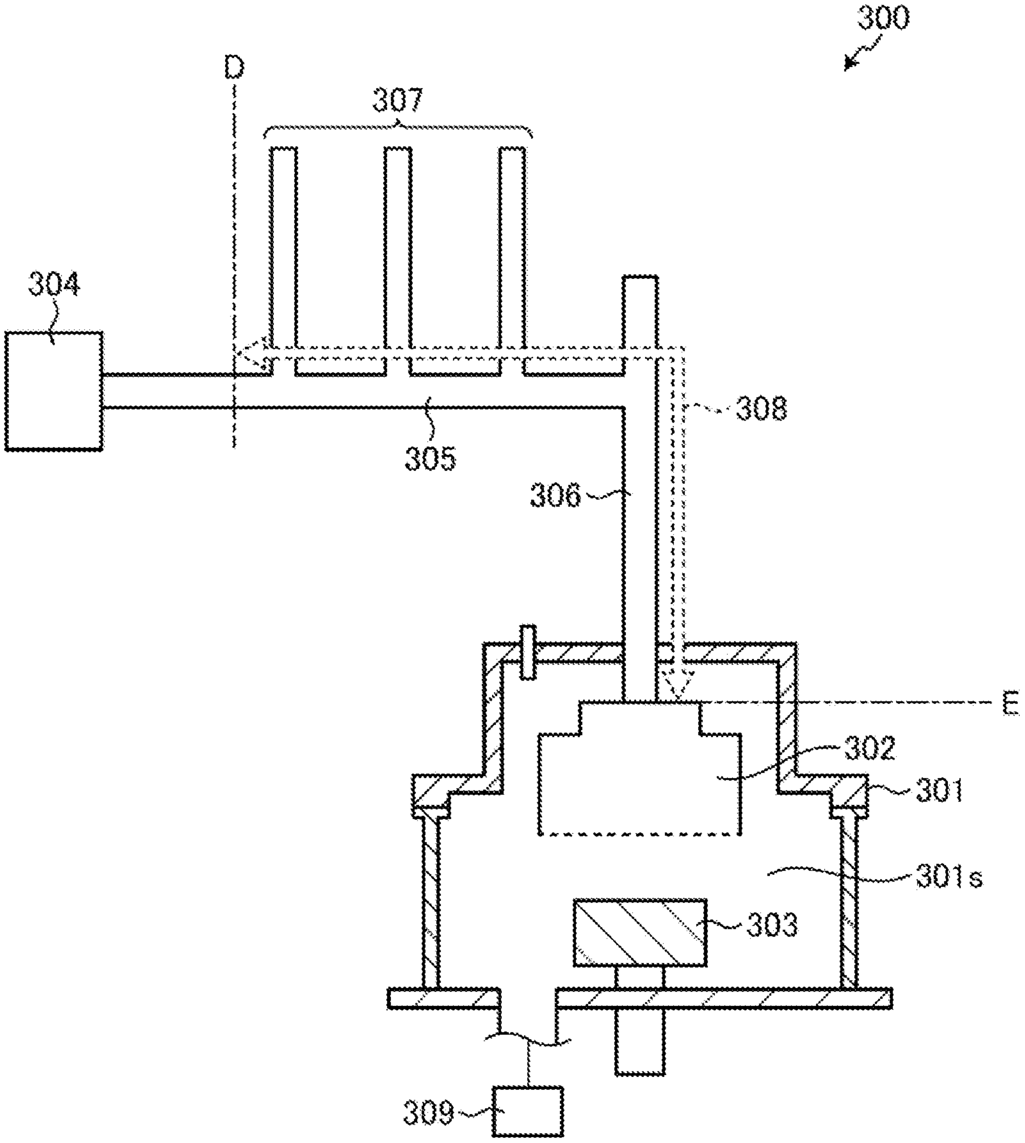
FIG. 6 is a schematic cross-sectional diagram showing an example of a configuration of a resonator according to a reference example.

Next, comparison with a resonator of a reference example will be described with reference to FIGS. 6 and 7. FIG. 6 is a schematic cross-sectional diagram showing an example of a configuration of a resonator in a reference example. A plasma processing apparatus 300 shown in FIG. 6 is a reference example of a remote plasma processing apparatus including a plasma generating room 302 in a chamber 301. The plasma processing apparatus 300 processes a substrate (not shown) placed on a loading table 303 provided in the chamber 301 by using plasma supplied from the plasma generating room 302 to a processing space 301*s*. An inside of the chamber 301 is exhausted by an exhauster 309 to create a vacuum atmosphere at a desired pressure. Electromagnetic waves (radio-frequency power) are supplied to the plasma generating room 302 from a microwave output 304 via a waveguide 305 and a coaxial waveguide 306. A stub 307 is provided at the waveguide 305 to adjust a resonance frequency. In the plasma processing apparatus 300, a section 308 from a point D to a point E becomes a resonator, i.e., a standing wave region. The section 308, which is a standing wave region of the reference example, has a length of 3λg/4+3λg/4=3λg/2, which is three times λg/2. In contrast, the section 233, which is the standing wave region of the embodiment of the present disclosure, has a length of approximately λg/4, which corresponds to ⅙ of the length of the reference example. That is, in the embodiment of the present disclosure, the size of the resonator may be significantly reduced compared to the reference example. Furthermore, since a magnitude of power loss (copper loss) is determined by a length of the standing wave region, if the standing wave region is short as in the embodiment of the present disclosure, the power loss may be reduced, achieving high efficiency. In the resonator 123 of the embodiment of the present disclosure, loss at a line length of λg/4 may be considered.

Figure 7:
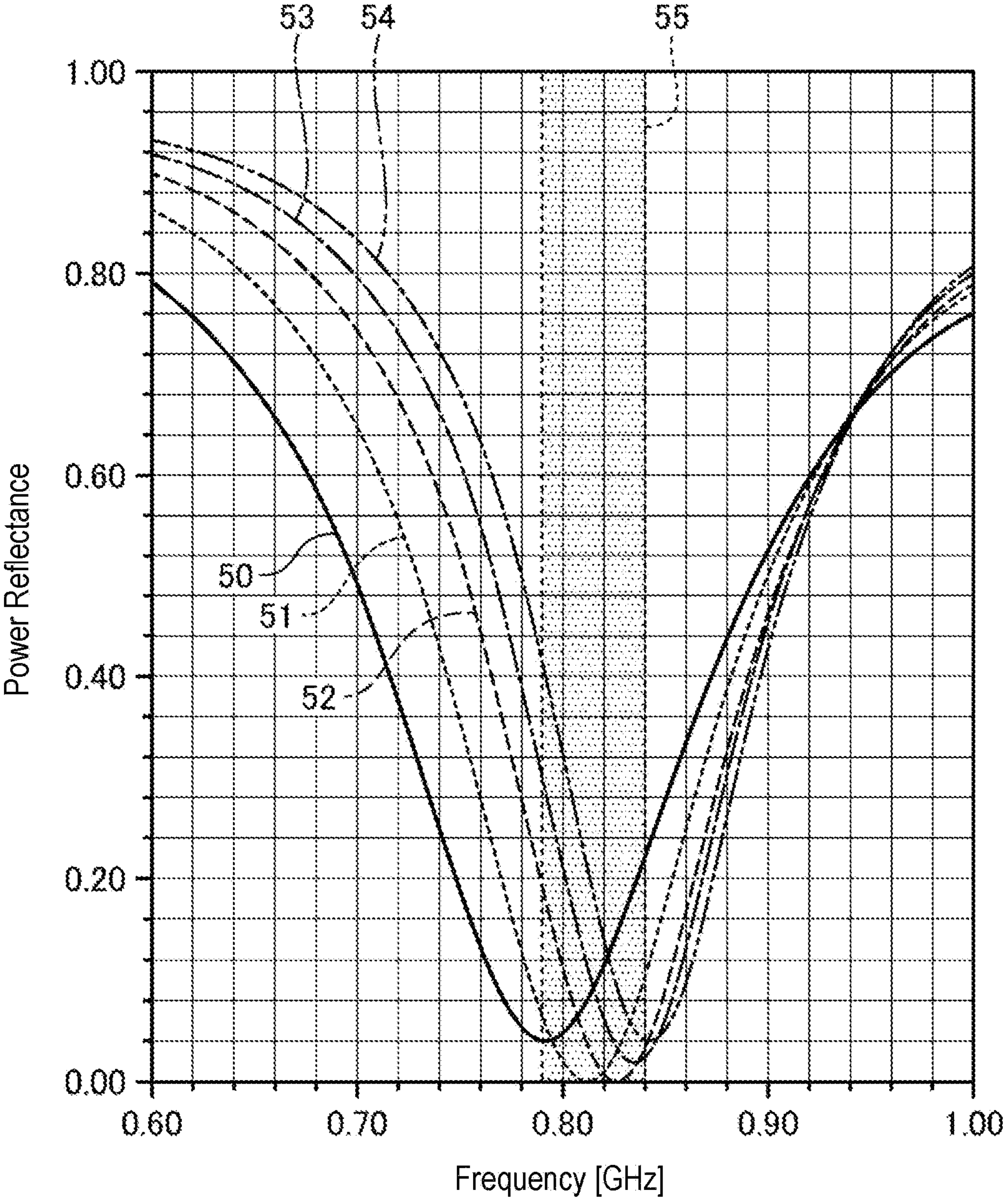
FIG. 7 is a graph showing an example of frequency characteristics of the resonator according to the reference example.

FIG. 7 is a graph showing an example of frequency characteristics of the resonator in the reference example. Graphs 50 to 54 shown in FIG. 7 show frequency characteristics of the resonator (section 308) in terms of power reflectance when impedance of the load (plasma) changes in the reference example as a result of a change in plasma density in the chamber 301. The graphs 50 to 54 represent the frequency characteristics of power reflectance when relative permittivity κp of plasma is 30, 40, 50, 60, and 70, respectively. As shown in the graphs 50 to 54, a frequency (resonance frequency) at which the power reflectance is the smallest falls within a range 55 of a width of 50 MHz from approximately 790 MHz to 840 MHz as the plasma density changes. When the frequency characteristics of the resonator 123 of the embodiment of the present disclosure shown in FIG. 4 are compared with the frequency characteristics of the resonator (section 308) of the reference example shown in FIG. 7, it may be observed that the width of change of the resonance frequency with respect to change of the plasma density becomes smaller as compared with the reference example.

As described above, according to the embodiment, the plasma processing apparatus 1 includes the processing container (chamber 101), the resonator 123 that resonates electromagnetic waves to be supplied, the slot antenna (antenna 121) connected to the resonator 123, and the transmission window (dielectric window 124) configured to transmit the electromagnetic waves radiated from the slot antenna and supply the electromagnetic waves into the processing container. The resonator 123 includes the input port 202, the output port 205, the power supply fin 224, and the ground fin 209. The input port 202 includes the inner shaft 204 and the outer cylinder 203. The output port 205 includes the inner shaft 207 and the outer cylinder 206. The power supply fin 224 connects the inner shaft 204 of the input port 202 and the inner shaft 207 of the output port 205 and is provided within the resonator 123. The ground fin 209 is connected to the outer cylinder 203 of the input port 202 and the outer cylinder 206 of the output port 205 at a same potential and protrudes within the resonator 123 so as to be inserted between the fins of the power supply fin 224. As a result, a plasma source may be miniaturized while being highly efficient.

Additionally, according to the embodiment of the present disclosure, the dielectric 228 is provided between the power supply fin 224 and the ground fin 209. As a result, the resonator 123 may be more miniaturized.

Additionally, according to the embodiment of the present disclosure, each of the input port 202 and the output port 205 has a coaxial structure. As a result, the resonator 123 for radio-frequency power of high output may be formed.

Additionally, according to the embodiment of the present disclosure, each of the power supply fin 224 and the ground fin 209 has a cylindrical shape. As a result, it is possible to perform a resonance at a frequency of supplied electromagnetic waves.

Additionally, according to the embodiment of the present disclosure, the power supply fin 224 is a multipole antenna. As a result, the range of the resonance frequency may be expanded.

Additionally, according to the embodiment of the present disclosure, the phase adjustor 230 that adjusts a phase of the electromagnetic waves is provided adjacent to the slot antenna of the output port 205. As a result, the resonance characteristics of the standing wave region of the resonator 123 may be strengthened.

Additionally, according to the embodiment of the present disclosure, the ground fin 209 is configured to be capable of changing the depth of insertion into the power supply fin 224. As a result, the resonator 123 may be made smaller with a simple structure. Further, the resonance frequency of the resonator 123 may be adjusted.

Additionally, according to the embodiment of the present disclosure, the dielectric 228 is provided between the power supply fin 224 and the ground fin 209. In addition, the ground fin 209 moves along the dielectric 228 when the depth of insertion into the power supply fin 224 is changed. As a result, the ground fin 209 may be moved without contacting the power supply fin 224.

Additionally, according to the embodiment of the present disclosure, the processing container includes a plasma generating room, and the transmission window is configured to supply electromagnetic waves into the plasma generating room. As a result, the plasma source may be miniaturized while being highly efficient even in a remote plasma processing apparatus.

Additionally, according to the embodiment of the present disclosure, sets of the resonator 123, the slot antenna, and the transmission window are provided at the processing container. As a result, even in a plasma processing apparatus including a plurality of plasma sources, the plasma source may be miniaturized while being highly efficient.

The embodiments disclosed herein are illustrative in all respects and should not be considered restrictive. The embodiments described above may be omitted, replaced, or modified in various forms without departing from the scope and spirit of the appended claims.

Furthermore, in the above-described embodiments, while the plasma processing apparatus 1 that directly generates plasma in the processing space in the chamber 101 has been described, the embodiments are not limited thereto. For example, the embodiments may also be applied to a remote plasma processing apparatus including a plasma generating room in a chamber.

The present disclosure may have the following configuration.

(1) A plasma processing apparatus is provided.

The plasma processing apparatus includes:

- a processing container;
- a resonator configured to resonate electromagnetic waves to be supplied;
- a slot antenna connected to the resonator; and
- a transmission window configured to transmit the electromagnetic waves radiated from the slot antenna and supply the electromagnetic waves into the processing container, wherein the resonator includes:

- an input port including an inner shaft and an outer cylinder;
- an output port including an inner shaft and an outer cylinder;
- a power supply fin connecting the inner shaft of the input port and the inner shaft of the output port and provided in the resonator; and
- a ground fin connected to the outer cylinder of the input port and the outer cylinder of the output port at a same potential and provided to protrude within the resonator so as to be inserted between fins of the power supply fin.

(2) In the plasma processing apparatus of (1), a dielectric is provided between the power supply fin and the ground fin.

(3) In the plasma processing apparatus of (1) or (2), each of the input port and the output port has a coaxial structure.

(4) In the plasma processing apparatus of any one of (1) to (3), each of the power supply fin and the ground fin has a cylindrical shape.

(5) In the plasma processing apparatus of (4), the power supply fin is a multipole antenna.

(6) In the plasma processing apparatus of any one of (1) to (5), a phase adjustor that adjusts a phase of the electromagnetic waves is configured in adjacent to the slot antenna of the output port.

(7) In the plasma processing apparatus of any one of (1) to (6), the ground fin is configured to be capable of changing a depth of insertion into the power supply fin.

(8) In the plasma processing apparatus of (7), a dielectric is provided between the power supply fin and the ground fin, and the ground fin moves along the dielectric when the depth of insertion into the power supply fin changes.

(9) In the plasma processing apparatus of any one of (1) to (8), the processing container includes a plasma generating room, and the transmission window is configured to supply the electromagnetic waves into the plasma generating room.

(10) In the plasma processing apparatus of any one of (1) to (8), sets of the resonator, the slot antenna, and the transmission window are provided at the processing container.

According to the present disclosure, a plasma source may be made highly efficient and compact.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus, comprising:

a processing container;

a resonator configured to resonate electromagnetic waves to be supplied;

a slot antenna connected to the resonator; and a transmission window configured to transmit the electromagnetic waves radiated from the slot antenna and supply the electromagnetic waves into the processing container, wherein the resonator includes:

an input port including an inner shaft and an outer cylinder;

an output port including an inner shaft and an outer cylinder;

a power supply fin connecting the inner shaft of the input port and the inner shaft of the output port and provided in the resonator; and a ground fin connected to the outer cylinder of the input port and the outer cylinder of the output port at a same potential and provided to protrude within the resonator so as to be inserted between fins of the power supply fin.

2. The plasma processing apparatus of claim 1, wherein a dielectric is provided between the power supply fin and the ground fin.

3. The plasma processing apparatus of claim 1, wherein each of the input port and the output port has a coaxial structure.

4. The plasma processing apparatus of claim 1, wherein each of the power supply fin and the ground fin has a cylindrical shape.

5. The plasma processing apparatus of claim 4, wherein the power supply fin is a multipole antenna.

6. The plasma processing apparatus of claim 1, further comprising a phase adjustor configured to adjust a phase of the electromagnetic waves adjacent to the slot antenna of the output port.

7. The plasma processing apparatus of claim 1, wherein the ground fin is configured to be capable of changing a depth of insertion into the power supply fin.

8. The plasma processing apparatus of claim 7, wherein a dielectric is provided between the power supply fin and the ground fin, and wherein the ground fin moves along the dielectric when the depth of insertion into the power supply fin changes.

9. The plasma processing apparatus of claim 1, wherein the processing container includes a plasma generating room, and wherein the transmission window is configured to supply the electromagnetic waves into the plasma generating room.

10. The plasma processing apparatus of claim 1, wherein sets of the resonator, the slot antenna, and the transmission window are provided at the processing container.

* * * * *